United States Patent

Withers et al.

[11] 4,001,697
[45] Jan. 4, 1977

[54] LINEAR A.C. MEASUREMENTS

[75] Inventors: Paul Owen Withers, Swindon; Eric Metcalf, Ropley, both of England

[73] Assignee: The Solartron Electronic Group Ltd., Farnborough, England

[22] Filed: Aug. 29, 1975

[21] Appl. No.: 609,320

[30] Foreign Application Priority Data

Sept. 6, 1974 United Kingdom ............ 39040/74

[52] U.S. Cl. .............................. 328/26; 307/235 R; 307/261; 321/8 R; 324/120; 328/150
[51] Int. Cl.² ..................... H02M 7/00; H03K 5/00
[58] Field of Search ......... 307/235 R, 261; 328/26, 328/150, 31; 324/119, 120; 321/8 R, 2

[56] References Cited
UNITED STATES PATENTS

| | | | |
|---|---|---|---|
| 3,571,706 | 3/1971 | Bjor | 328/26 X |
| 3,652,945 | 3/1972 | Nakane et al. | 328/26 X |
| 3,723,845 | 3/1973 | Duckworth | 307/261 X |

*Primary Examiner*—John Zazworsky
*Attorney, Agent, or Firm*—William R. Sherman; K. McMahon

[57] ABSTRACT

A highly linear AC to DC conversion system comprises a variable gain amplifier via which an AC signal to be converted is applied to an AC/DC converter. The output of the AC/DC converter is compared with a reference level and a control signal dependent on the difference therebetween adjusts the gain of the variable gain amplifier so as to reduce the difference. The output of the AC/DC converter is also applied to one input of a comparator, whose DC output is applied via the variable gain amplifier to the other input of the comparator. The variable gain amplifier has exactly the same gain for both AC and DC signals. It can then be shown that the DC output signal produced by the comparator is very accurately linearly related to the magnitude of the AC input signal.

15 Claims, 5 Drawing Figures

LINEAR A.C. MEASUREMENTS

This invention relates to A.C. to D.C. conversion systems, and is more particularly but not exclusively concerned with A.C. to D.C. conversion systems for producing a D.C. output signal whose magnitude is linearly related to the RMS value of an A.C. input signal over a wide dynamic range of the input signal.

A.C. to D.C. conversion systems are frequently used in conjunction with analogue-to-digital converters, which convert the D.C. output signal produced by the A.C. to D.C. conversion system to a digital signal representative of the magnitude of the D.C. output signal. This digital signal is therefore also representative of the magnitude of the original A.C. input signal applied to the A.C. to D.C. conversion system.

Currently available analogue-to-digital converters may typically have a dynamic range of 100,000, that is they are capable of converting a D.C. signal whose minimum and maximum possible magnitudes differ by a factor of 100,000, and they can be highly linear over this wide dynamic range. A typical example of such an anlogue-to-digital converter is disclosed in our co-pending United Kingdom Patent Application No. 36325/73. However, currently available A.C. to D.C. conversion systems, particularly RMS sensing systems such as those of the thermal converter type, are linear only over a much smaller dynamic range, typically about 1000, and even a dynamic range of this magnitude is usually only achieved at the expense of a reduced frequency response. Additionally, the accurate conversion of A.C. signals of small magnitude is particularly difficult.

It is therefore an object of the present invention to provide an A.C. to D.C. conversion system capable of converting an A.C. input signal, whose magnitude may lie in a relatively wide dynamic range, to a D.C. output signal whose magnitude is linearly related to that of the A.C. input signal.

According to the present invention, therefore, there is provided an A.C. to D.C. conversion system comprising:

variable gain amplifying means for receiving and amplifying an A.C. input signal to be converted;

an A.C. to D.C. converter connected to receive the amplified A.C. signal from the variable gain amplifying means and arranged to convert the amplified A.C. signal to a first D.C. signal whose magnitude is dependent upon the magnitude of the amplified A.C. signal;

a first signal comparator arranged to compare the magnitude of the first D.C. signal with a reference magnitude and to produce a control signal dependent on the difference therebetween, the control signal being applied to the variable gain amplifier means to vary the gain thereof, whereby to change the magnitude of the amplified A.C. signal in the sense that tends to reduce the difference between the magnitude of the first D.C. signal and the reference magnitude; and a second signal comparator arranged to compare the magnitude of said first D.C. signal with the magnitude of a second D.C. signal and to produce a D.C. output signal dependent upon the difference therebetween, said D.C. output signal being applied to and amplified by the variable gain amplifying means to produce the second D.C. signal and the second signal comparator being operative to maintain the magnitude of the second D.C. signal substantially equal to the magnitude of the first D.C. signal;

the ratio between the respective gains of the variable gain amplifier means for A.C. and D.C. signals being substantially constant, whereby the magnitude of the D.C. output signal is substantially linearly related to the magnitude of the A.C. input signal.

In one embodiment of the invention, the variable gain amplifying means comprises first and second variable gain amplifiers which are each connected to receive the control signal, and whose respective gains vary in a substantially identical manner in response to the control signal, the first variable gain amplifier having an input for receiving the A.C. input signal and an output at which the amplified A.C. signal appears, and the second variable gain amplifier having an input to which the D.C. output signal is applied and an output at which the second D.C. signal appears.

In a second and preferred embodiment of the invention, the variable gain amplifying means comprises a single variable gain amplifier, and a high pass filter and a low pass filter both connected to the output of this amplifier, whereby the amplified A.C. signal and the second D.C. signal appear at the respective outputs of the high and low pass filters respectively.

The variable gain amplifier or amplifiers may include at least one adjustable light source, the control signal being applied to the light source to vary the amount of light emitted thereby, and the or each variable gain amplifier may include at least one circuit element having a parameter which varies in response to the amount of light received by the circuit element and which at least partly defines the gain of its variable gain amplifier, the circuit element being disposed to receive light from the light source. Conveniently, the or each circuit element comprises a light-responsive resistance element. Thus the or each variable gain amplifier may comprise a high gain amplifier having an input resistance and a negative feedback resistance, at least one of said input and feedback resistances including the or a respective light-responsive resistance element. Preferably, the or each input resistance is fixed in value and the or each feedback resistance includes the or a respective light-responsive resistance element.

The light source may advantageously comprise a light-emitting diode.

The second signal comparator may comprise a signal comparison circuit connected to receive the first and second D.C. signals and arranged to produce an intermediate D.C. signal dependent upon the difference in magnitude therebetween, and second variable gain amplifying means connected to receive and amplify the intermediate D.C. signal to produce the D.C. output signal, the gain of the second variable gain amplifying means being arranged to vary approximately inversely with the gain of the firstmentioned variable gain amplifying means, whereby the loop gain of the loop comprising the second signal comparator and the first-mentioned variable gain amplifying means remains approximately constant.

The second variable gain amplifying means may be connected to receive the control signal, whereby its gain is varied by the control signal. In this case, the second variable gain amplifying means may conveniently comprise a high gain amplifier having an input resistance and a negative feedback resistance, at least one of said input and feedback resistances including a further light-responsive resistance element disposed to receive light from said light source. Preferably, where the or each input resistance of the firstmentioned variable gain amplifying means is fixed in value, the feedback resistance in the second variable gain amplifying means is also fixed in value while the input resistance of the second variable gain amplifying means includes the further light-responsive resistance element.

Alternatively, the second signal comparator may further comprise a second signal comparison circuit arranged to compare the magnitude of the intermediate D.C. signal with a second reference magnitude and to produce a further control signal dependent upon the difference therebetween, the further control signal being applied to the second variable gain amplifier means to vary the gain thereof, whereby to change the magnitude of the intermediate D.C. signal in the sense that tends to reduce the difference between the magnitude of the intermediate D.C. signal and the second reference magnitude. Conveniently the second reference magnitude is equal to the firstmentioned reference magnitude.

The A.C. to D.C. converter may advantageously comprise an RMS sensing A.C. to D.C. converter.

The invention will now be described, by way of non-limitative example only, with reference to the accompanying drawings, of which:

Figure 1:
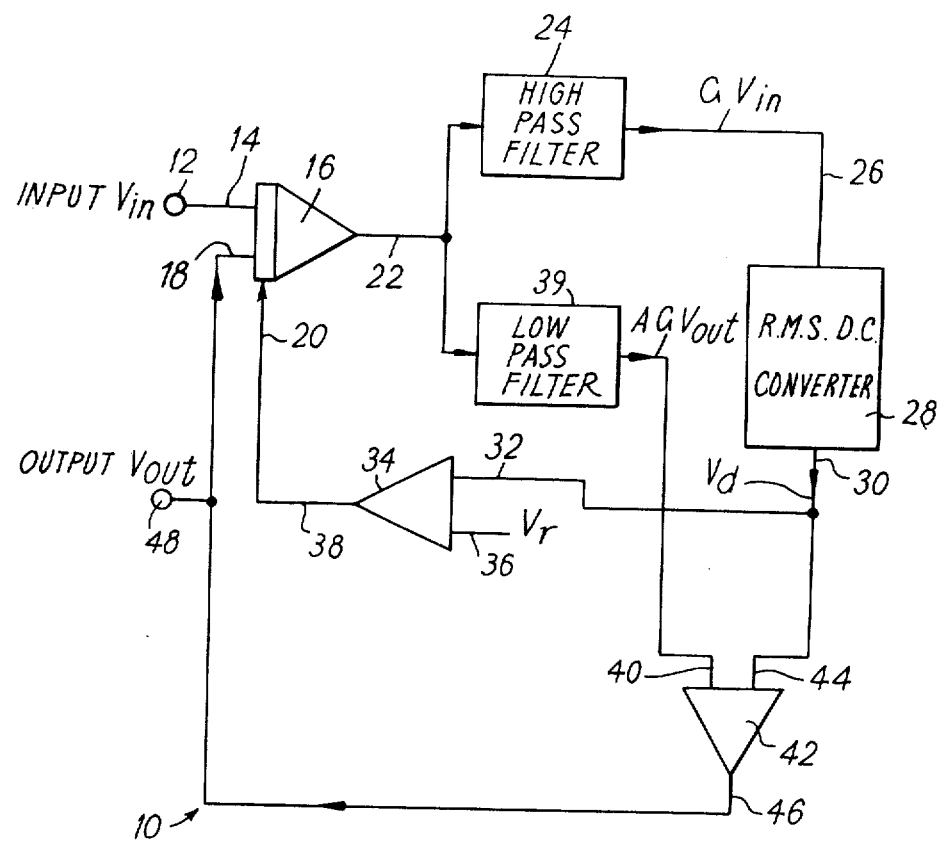
FIG. 1 is a block circuit diagram of one embodiment of an A.C. to D.C. conversion system in accordance with the present invention.

The A.C. to D.C. conversion system of FIG. 1 is indicated generally at 10, and comprises an input terminal 12 to which an A.C. input voltage $V_{in}$ to be converted is applied. The terminal 12 is connected to a first (or A.C.) signal input 14 of a variable gain amplifier 16, which has a second (or D.C.) signal input 18. The amplifier 16 has a variable gain G for A.C. signals which are applied to its input 14 and whose frequency lies in the range 40Hz to 100kHz, and a variable gain AG for D.C. signals applied to its input 18, where A is a constant which could for example be unity: thus the ratio between the variable A.C. gain G of the amplifier 16 and its variable D.C. gain AG is equal to 1/A, which is constant. Typically, the variable gains are each variable between maximum and minimum values differing by a factor of up to 1000. The amplifier 16 has a control input 20, whereby its A.C. to D.C. gains may be varied in unison by means of a variable magnitude D.C. control signal, and an output 22.

The output 22 of the amplifier 16 is connected, via a high-pass filter 24 having a lower −3dB point typically at 1Hz, to the input 26 of a RMS to D.C. converter 28. The converter 28 may be of any convenient type, for example a type 440K or a type R310 modular RMS to D.C. converter as manufactured by Analogue Devices, Inc. and Intronics Ltd. respectively, and has an output 30 which is connected to one input 32 of a voltage comparator 34. The voltage comparator 34 has a second input 36 connected to receive a D.C. reference voltage $V_r$ of about one volt, and an output 38 which is connected to the control input 20 of the amplifier 16.

The output 22 of the amplifier 16 is also connected, via a low-pass filter 39 having an upper −3dB point typically at 1Hz, to one input 40 of a second voltage comparator 42. The voltage comparator 42 has a second input 44 connected to the output 30 of the converter 28, and an output 46 which is connected to the second input 18 of the amplifier 16 and to an output terminal 48 which is the output terminal of the system 10.

In operation, the A.C. input voltage $V_{in}$ to be converted is applied to the terminal 12 and thus to the input 14 of the amplifier 16. The amplifier 14 multiplies the magnitude of the A.C. input voltage by its variable A.C. gain G, thus producing an amplified A.C. voltage whose magnitude is given by $GV_{in}$, and this amplified A.C. voltage is applied via the high pass filter 24 to the input 26 of the converter 28. The converter 28 converts this amplified A.C. voltage to a D.C. voltage $V_d$ whose magnitude is proportional to the RMS value of the amplified A.C. voltage, so that $$V_d = kG\ (V_{in})_{RMS}. \qquad (1)$$

where $k$ is the conversion constant of the converter 28.

The voltage $V_d$ is compared with the reference voltage $V_r$ by the voltage comparator 34, which produces at its output 38 a D.C. control signal dependent on the difference between the voltages $V_d$ and $V_r$. This control signal is applied to the control input 20 of the amplifier 16, and varies the gain G of the amplifier 16 so as to change the magnitude of the amplified A.C. voltage in the sense which reduces the difference between the voltages $V_d$ and $V_r$. Thus, if the magnitude of the A.C. input voltage $V_{in}$ increases, so that the magnitude of the amplified A.C. voltage applied to the converter 28 tends to increase, then the control signal produced by the voltage comparator 34 changes in a direction which decreases the gain G of the amplifier 16 so as to oppose the change in magnitude of the amplified A.C. voltage. Conversely, if the magnitude of the A.C. input voltage $V_{in}$ decreases, so that the magnitude of the amplified A.C. voltage tends to decrease, then the control signal produced by the voltage comparator 34 changes in the opposite direction, to increase the gain G of the amplifier 16 so as to oppose the change in magnitude of the amplified A.C. voltage. The closed loop comprising the amplifier 16, the filter 24, the converter 28 and the comparator 34 thus ensures that the converter 28 operates to convert an A.C. voltage of substantially constant magnitude, irrespective of the magnitude of the A.C. input voltage $V_{in}$, to produce an output voltage $V_d$ also of substantially constant magnitude. If the loop gain of the aforementioned closed loop is sufficiently high, the voltage $V_d$ is given by $$V_d = V_r = \text{constant} \qquad (2)$$

The voltage $V_d$ is also applied to the input 44 of the voltage comparator 42, which produces a D.C. output voltage $V_{out}$. The voltage $V_{out}$ is applied to the input 18 of the variable gain amplifier 16, which multiplies the magnitude of the voltage $V_{out}$ by its variable D.C. gain AG. Thus the amplifier 16 simultaneously amplifies both an A.C. signal and a D.C. signal, the A.C. and D.C. components of the composite signal at its output 22 being separated by the filters 24 and 39. The D.C. component of the signal at the output 22 of the amplifier 16 thus has a magnitude AG $V_{out}$, and is applied via the low pass filter 39 to the other input 40 of the comparator 42, which varies the voltage $V_{out}$ until the respective voltages at its inputs 40, 44 are substantially equal. Thus if the loop gain round the closed loop defined by the amplifier 16, the filter 39 and the comparator 42 is sufficiently high, $$AG \, V_{out} = V_d \qquad (3)$$

Combining equations (1) and (3) gives $$V_{out} = (k/A)(V_{in})_{RMS} \qquad (4)$$

Thus as long as $k$, the conversion constant of the converter 28, really is constant, the magnitude of the D.C. output voltage $V_{out}$ appearing at the output terminal 48 is linearly related to the RMS value of the A.C. input voltage $V_{in}$. But, as already mentioned, the closed loop comprising the amplifier 16, the filter 24, the converter 28 and the comparator 32 ensures that the converter 28 operates on an A.C. voltage $GV_{in}$ of substantially constant magnitude, i.e. the converter 28 operates over only a very small part of its normal dynamic range: typically its output voltage $V_d$ is held within a few millivolts of the reference voltage $V_r$. Moreover, this small part of the normal dynamic range of the converter 28 is arranged to be in the centre of the most linear portion of its conversion characteristic. The conversion constant $k$ of the converter 28 is therefore very accurately constant in this small part of its dynamic range, so that the magnitude of the output voltage $V_{out}$ is linearly related to the RMS value of the input voltage $V_{in}$ to a very high degree of accuracy.

In practice, the voltage $V_d$ (and therefore the magnitude of the amplified A.C. voltage applied to the converter 28) is maintained substantially constant only for A.C. input signals whose RMS values lie between $V_r KG_{max}$ and $V_r/kG_{min}$, where $G_{max}$ and $G_{min}$ are the maximum and minimum possible values of the A.C. gain of the amplifier 16. As the RMS value of the A.C. input signal begins to fall below the former value or rise above the latter value, the A.C. gain of the amplifier 16 cannot further increase or decrease respectively, so the amplified A.C. voltage applied to the converter 28 begins to fall or rise respectively. However, as already mentioned the converter 28 is arranged to operate at the centre of the most linear portion of its conversion characteristic while the voltage $V_d$ is being held substantially constant, so that even when the voltage $V_d$ can no longer be held constant, the converter 28 still operates in the most linear portion of its characteristic, albeit not in the centre of this portion. Thus the closed loop comprising the amplifier 16, the filter 24, the converter 28 and the comparator 32 effectively compresses a very wide dynamic range of the A.C. input signal into a much smaller dynamic range of the amplified A.C. signal applied to the converter 28, thus ensuring that the converter 28 operates in the most linear portion of its conversion characteristic even for A.C. input signals whose RMS values lie outside the range of RMS values for which the converter 28 is linear. It will be appreciated, therefore, that the reference voltage $V_r$ need be only approximately constant, since small variations in this voltage, leading to small variations in the voltage $V_d$, do not significantly affect the accuracy of the conversion system 10.

Figure 2:
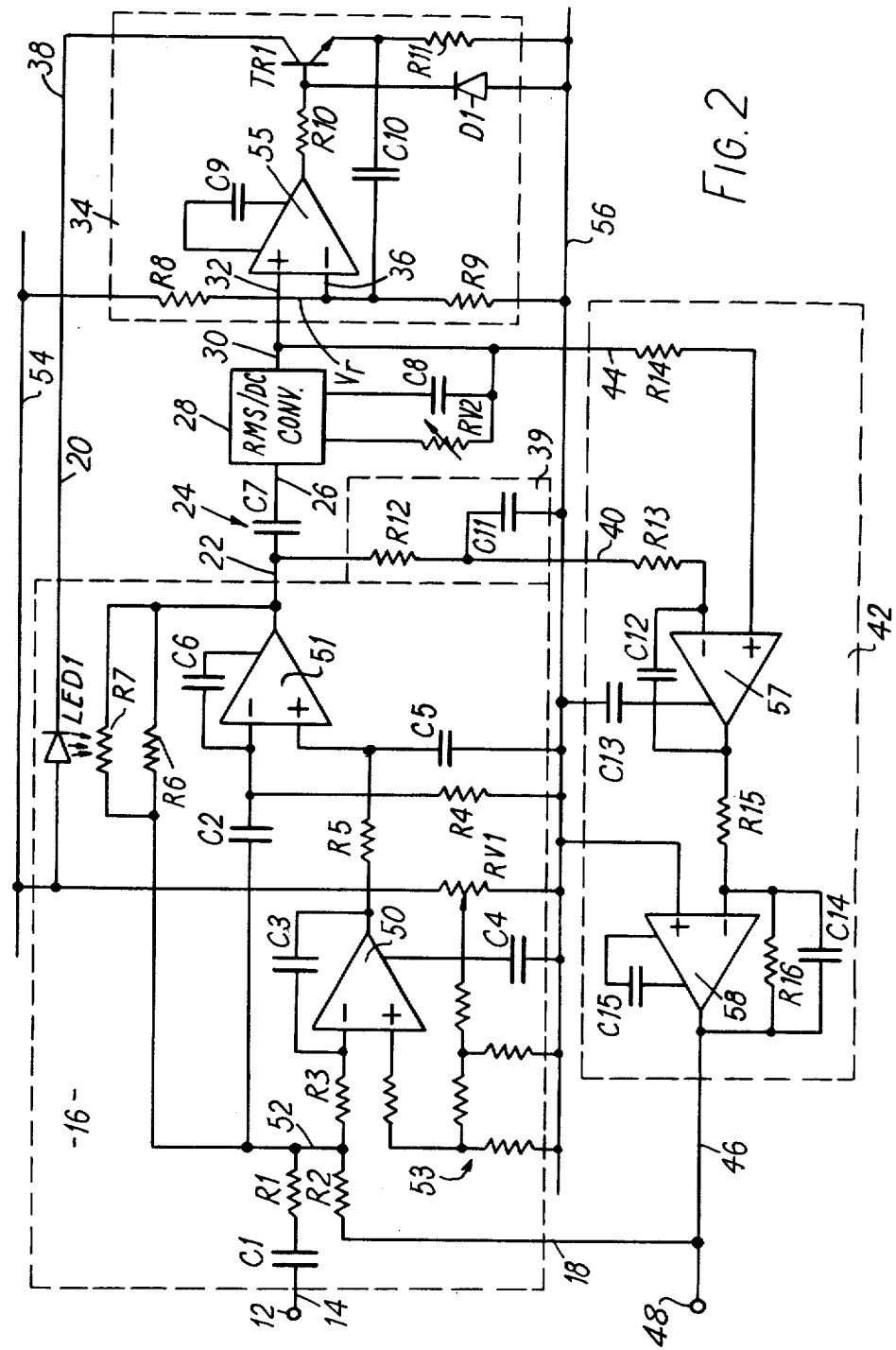
FIG. 2 is a detailed circuit diagram of a specific implementation of the conversion system of FIG. 1.

A detailed circuit diagram of a specific implementation of the conversion system 10 is shown in FIG. 2, where circuit elements corresponding to like circuit elements shown in FIG. 1 are enclosed in dotted rectangles and are given the same reference numerals as were used in FIG. 1.

Thus in FIG. 2, the variable gain amplifier 16 comprises first and second high gain integrated circuit differential amplifiers 50 and 51, each having a non-inverting input and an inverting input conventionally indicated by plus and minus signs respectively. The A.C. input 14 of the amplifier 16 is connected via a D.C. blocking capacitor C1 and a resistor R1 in series to a summing point 52, while the D.C. input 18 is connected to the summing point 52 via a resistor R2. The resistors R1 and R2 are precision resistors, but not necessarily equal in value. The summing point 52 is connected via a resistor R3 to the inverting input of the amplifier 50, and via a differentiator comprising a capacitor C2 and a resistor R4 to the inverting input of the amplifier 51.

The non-inverting input of the amplifier 50 is connected to an adjustable biassing network 53 including a variable resistor RV1, which is adjusted to compensate for the offset voltage of the amplifier 50. The amplifier 50 has a negative feedback capacitor C3 connected between its output and its inverting input, and a suitable response-shaping capacitor such as that indicated at C4. The output of the amplifier 50 is connected, via a low pass filter comprising a resistor R5 and a capacitor C5, to the non-inverting input of the amplifier 51.

The amplifier 51 is provided with a suitable response-shaping capacitor such as that indicated at C6, and its output is negative feedback connected via the parallel combination of a resistor R6 and a photosensitive resistor (or photocell) R7 is mounted in a common package with, and receives light from, a light-emitting diode LED 1, a suitable example of such a photosensitive resistor/diode combination being a type PLF 5S380 LED/Photocell pair as manufactured by National Semiconductors of Canada. The anode of the diode LED 1 is connected to a positive voltage supply rail 54, while its cathode constitutes the control input 20 of the amplifier 16.

The operation of the amplifier 16 is relatively conventional, in that the D.C. voltage applied to the input 18 is amplified by both amplifiers 50 and 51 in cascade, the amplifier 50 operating as an inverting stage. The capacitor C3 and the filter including the capacitor C5 ensures that the amplifier 50 has no significant A.C. gain, while the capacitor C2 blocks the application of any D.C. voltage due to the voltage at the input 18 to the inverting input of the amplifier 51. The capacitor C2 also ensures that the A.C. voltage applied to the input 14 bypasses the amplifier 50, and is applied to the inverting input of the amplifier 51. The amplifier 51 thus acts as an inverting stage for the A.C. voltage, and effectively sums and amplifies the inverted A.C. voltage and the already inverted and amplified D.C. voltage from the amplifier 50.

Since the amplifiers 50, 51 have very high gains, the amplifier 16 may be regarded as an operational amplifier, whose overall gain for A.C. signals is defined by the ratio between the respective resistance values of the parallel combination of the resistors R6 and R7 and the resistor R1, $$\text{i.e.} \quad \frac{R6 \cdot R7}{R1(R6 + R7)} = G \qquad (5)$$

and whose overall gain for D.C. signals is defined by the ratio between the resistance values of the aforementioned parallel combination and the resistor R2, i.e. $\frac{R6 \cdot R7}{R2(R6 + R7)} = AG$, where $A = \frac{R1}{R2}$ (6)

It will be appreciated that the resistance value of the parallel combination of the resistors R6 and R7, and therefore the variable gains G and AG, is varied by varying the current supplied to the diode LED 1, which varies the amount of light emitted by this diode and therefore the amount of light incident on the photosensitive resistor R7. This in turn varies the resistance of the resistor R7, typically between maximum and minimum values differing by a factor of up to $10^6$. The variable gains G and AG correspondingly vary in unison between maximum and minimum values typically differing by a factor of up to about 1000.

The output of the amplifier 51 constitutes the output 22 of the amplifier 16, and is connected, via a large value D.C. blocking capacitor C7 which constitutes the high pass filter 24, to the input 26 of the RMS to D.C. converter 28. The converter 28 comprises a type 440K modular converter as mentioned earlier, and has an external variable resistor RV 2 for gain-setting and an external response-shaped capacitor C8.

The voltage comparator 34 comprises an integrated circuit differential amplifier 55, whose non-inverting and inverting inputs constitute the inputs 32 and 36 respectively. The amplifier 55 is provided with a suitable response shaping capacitor C9. The reference voltage $V_r$ applied to the input 36 is derived from the junction between two resistors R8 and R9, which are connected as a potential divider between the rail 54 and a 0 volt supply rail 56. It will be appreciated that the voltage $V_r$ will therefore vary slightly with variations in the supply voltage between the rails 54 and 56. However, this does not significantly affect the accuracy of the conversion system 10, since the function of the closed loop defined by the amplifier 16, the filter 24, the converter 28 and the comparator 34 is to reduce significantly the dynamic range of the A.C. voltages applied to input 26 of the converter 28; to achieve this, it is necessary only that the voltage $V_r$ be approximately constant.

The voltage comparator 34 further comprises an NPN transistor TR1, whose base is connected to the output of the amplifier 55 via a resistor R10. A clamping diode D1 is connected between the base of the transistor TR1 and the rail 56, in order to limit the maximum negative voltage at the base. The emitter of the transistor TR1 is connected via a negative feedback capacitor C10 to the inverting input of the amplifier 55, and via a resistor R11 to the rail 56. The collector of the transistor TR1 constitutes the output 38 of the comparator 34, and is therefore connected to the cathode of the diode LED 1.

If the voltage at the output 30 of the converter 28 tends to increase, the voltage at the output of the amplifier 55 also increases (since the output 30 is connected to the non-inverting input of the amplifier 55). The transistor TR1 therefore increases the current flowing in the diode LED1, which emits more light. This reduces the resistance value of the photosensitive resistor R7, thereby reducing the gain of the amplifier 16. This in turn reduces the magnitude of the A.C. voltage applied at the converter 28, thereby opposing the original change at the output 30 of the converter 28. Decreases in the voltage at the output 30 of the converter 28 are opposed in an analagous manner.

The output of the amplifier 51 is also connected, via two resistors R12 and R13 in series, to the inverting input of yet another integrated circuit differential amplifier 57. A capacitor C11 is connected between the junction of the resistors R12, R13 and the rail 56, and a capacitor C12 is feedback connected between the output and the non-inverting input of the amplifier 57. The amplifier also has a response-shaping capacitor C13. The output 30 of the converter 28 is connected via a resistor R14 to the non-inverting input of the amplifier 57. The resistor R12 and capacitor C11 together constitute the filter 39, while the amplifier 57 forms part of the voltage comparator 42. The resistor R13 and capacitor C12 form another low pass filter in conjunction with the amplifier 57, to augment the filtering performed by the filter 39.

The voltage comparator 42 also includes a further integrated differential amplifier 58, whose inverting input is connected to the output of the amplifier 57 via a resistor R15, and whose non-inverting input is connected to the rail 56. The amplifier 58 has a capacitor C14 and a resistor R16 connected in parallel between its output and its inverting input, and a response shaping capacitor C15. The output of the amplifier 58 constitutes the output 46 of the comparator 42, and is therefore connected to the input 18 of the amplifier 16 and to the output terminal 48.

As the voltage at the input 40 of the comparator 42 tends to increase, as a result of an increase in the A.C. input voltage $V_{in}$, the voltage at the inverting input of the amplifier 57 in the comparator 47 also tends to increase, so the voltage at the output of this amplifier decreases. The amplifier 58 forms with its associated input and feedback resistors R15 and R16 a simple inverting amplifier stage, so the voltage $V_{out}$ at the output of the amplifier 58, which voltage is applied to the input resistor R2 in the amplifier 12, increases. This decreases the D.C. component of the voltage at the output of the amplifier 51 in the amplifier 16, thereby opposing the original change in voltage at the input 40 of the comparator 42. Decreases in the voltage at the input 40 of the comparator 42 are analogously opposed. The amplifiers 57 and 58 of the comparator 42 thus adjust the magnitude of the output voltage $V_{out}$ so as to maintain the respective voltages at the inputs 40, 44 of the comparator 42 substantially equal.

Figure 3:
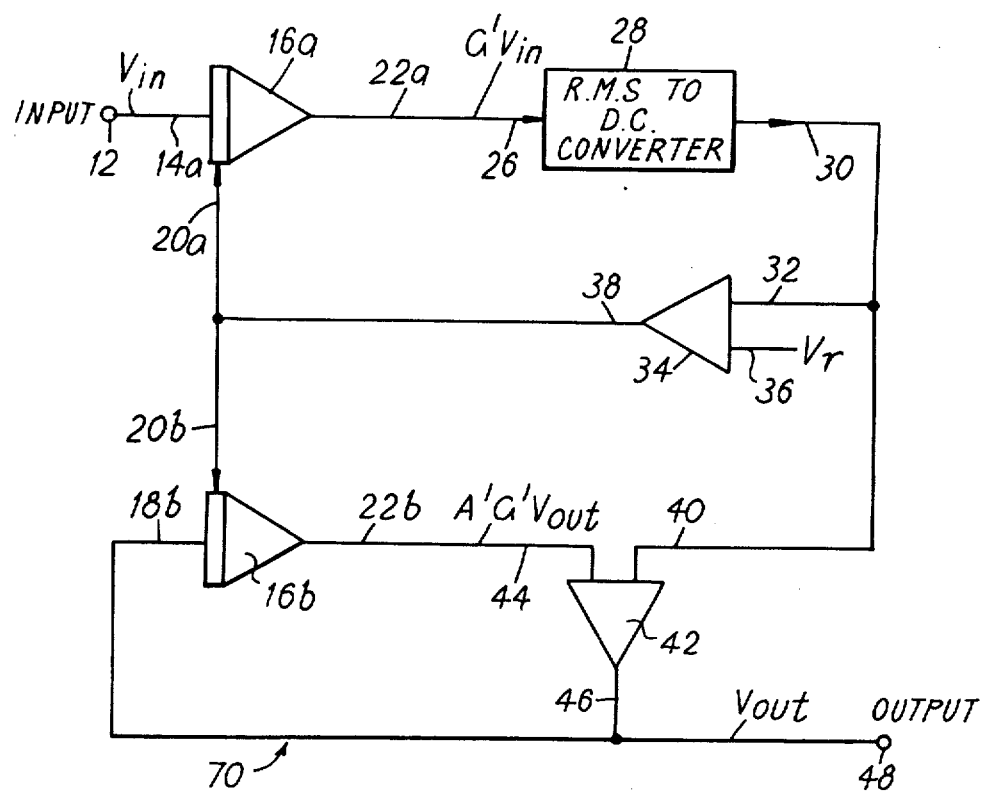
FIGS. 3 and 4 and 5 are block circuit diagrams of three further embodiments of A.C. to D.C. conversion systems in accordance with the present invention.

Turning now to FIG. 3, the conversion system shown therein in indicated generally at 70, and has many parts in common with the system 10 of FIG. 1. These common parts are therefore given the same reference numerals as were used in FIG. 1, and only the points of difference will be described. Thus the single variable gain amplifier 16 of FIG. 1 is replaced in the system 70 by two variable gain amplifiers 16a and 16b, and the filters 24 and 29 are omitted. The amplifier 16a has a single signal input 14a connected to the terminal 12, and an output 22a connected to the input 26 of the converter 28. The amplifier 16b has a single signal input 18b connected to the output 46 of the voltage comparator 42 and to the output terminal 48, and an output 22b connected to the input 40 of the comparator 42. The amplifiers 16a, 16b have respective control inputs 20a, 20b which are both connected to the output 38 of the voltage comparator 34.

The respective gains of the amplifiers 16a, 16b, which gains need not necessarily be the same, are arranged to vary in a substantially identical manner in response to the variable D.C. control signal produced by the comparator 34, i.e. they are varied in unison so that the ratio between them remains constant. Thus if the variable gain of the amplifier 16a is G', then that of the amplifier 16b is A'G', where A' is a constant. It will therefore be appreciated that the principle of operation of the system 70 is substantially the same as that of the system 10, the only difference being that the amplifier 16a is required to amplify only A.C. signals, while the amplifier 16b is required to amplify only D.C. signals. This simplifies the design of the individual amplifiers 16a and 16b to some extent, since the design requirements for each are less onerous than those for the single A.C. and D.C. amplifier 16 of the system 10.

However, this simplification is to some extent offset by difficulty in ensuring that the respective gains of the amplifiers 16a and 16b track each other correctly as they vary. In practice, each of the amplifiers 16a and 16b is implemented as an operational amplifier whose gain is defined by a negative feedback resistor combination similar to the resistors R6 and R7 of FIG. 2, the two photosensitive resistors in the respective combinations being substantially matched and disposed to receive light from a single light emitting diode common to both amplifiers. A type PLF5S33 LED/dual photocell device as manufactured by National Semiconductor of Canada is an example of a suitable single light emitting diode/twin photosensitive resistive device for use in the amplifiers 16a and 16b.

Figure 4:
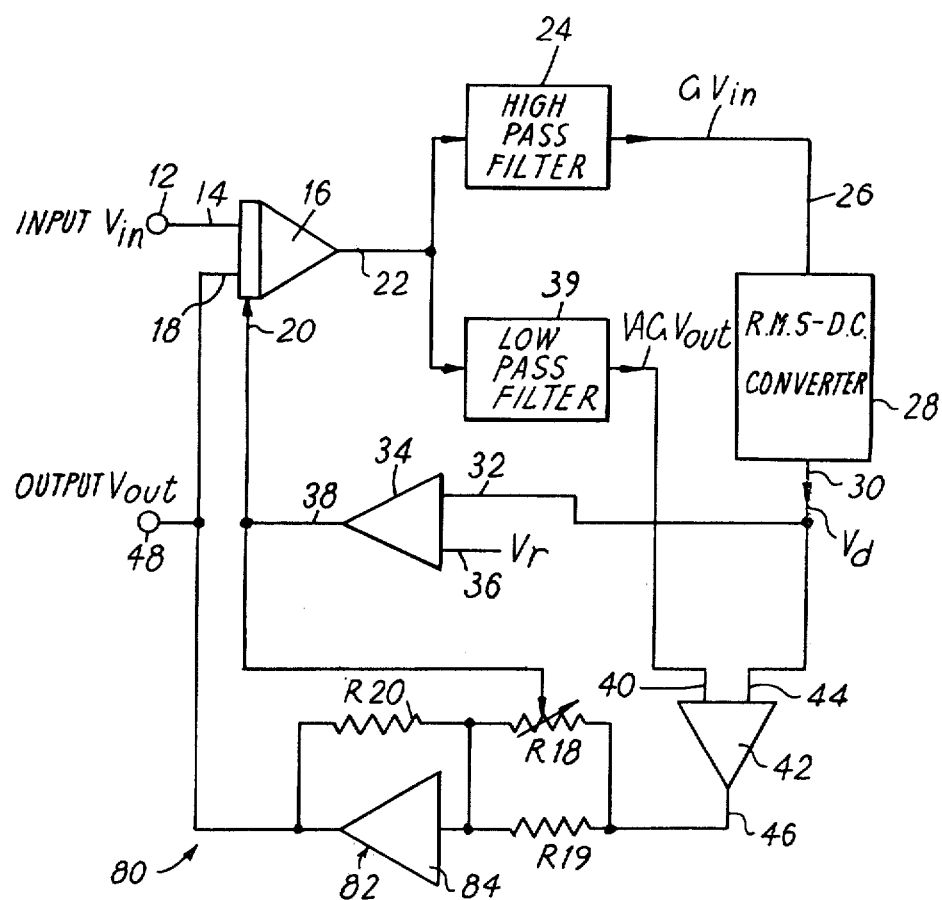

FIG. 4 shows, at 80, yet another A.C. to D.C. conversion system having many parts in common with the system 10 of FIG. 1: again, these common parts are given the same reference numerals as were used in FIG. 1, and only the points of difference will be described. In the system 80 of FIG. 4, the output 46 of the voltage comparator 42 is connected to the input 18 of the amplifier 16 and to the output terminal 48 via a variable gain operation amplifier 82. The amplifier 82 comprises a high gain inverting amplifier 84 having a variable input resistance, comprising two resistors R18 and R19 connected in parallel, and a feedback resistor R20. Since the amplifier 82 is an inverting amplifier, it is of course necessary to provide another, compensating, inversion in the comparator 42, e.g. by interchanging the signals applied to its inputs 40 and 44.

The resistor R18 is a photosensitive resistor similar to the resistor R7 of FIG. 2, and its value is varied by the control signal produced by the comparator 34. The respective resistance values of the feedback resistance constituted by the resistors R6 and R7 in the amplifier 16 and of the input resistance constituted by the resistors R18, R19 in the amplifier 82 are arranged to vary in an approximately similar manner, i.e. the ratio between these resistance values remains approximately constant, so that the combined gain of the amplifiers 16 and 82 also remains approximately constant. The loop gain round the closed loop comprising the amplifier 16, the comparator 42 and the amplifier 82 thus remains approximately constant, irrespective of the magnitude of the A.C. input voltage $V_{in}$, which significantly improves the accuracy and settling time of the system 80 when converting relatively low frequency A.C. input signals. The operation of the system 80 is otherwise identical to that of the system 10 of FIG. 1.

In practice, the amplifier 82 can be implemented by employing the amplifier 58 of FIG. 2 as the amplifier 84. In this case, the feedback resistor R16 of FIG. 2 is equivalent to the feedback resistor R20 of FIG. 4, and the resistor R15 of FIG. 2 is replaced by the parallel resistors R18, R19 of FIG. 4: since the amplifier 58 of FIG. 2 is already an inverting amplifier, the further compensating inversion mentioned earlier in relation to FIG. 4 is not required. The photosensitive resistor R18 is disposed in a common package with the resistor R7 of FIG. 2 to receive light from a single light emitting diode, e.g. the resistors R7, R18 and the light emitting diode may be constituted by the type PLF 5S33 device mentioned earlier.

Figure 5:
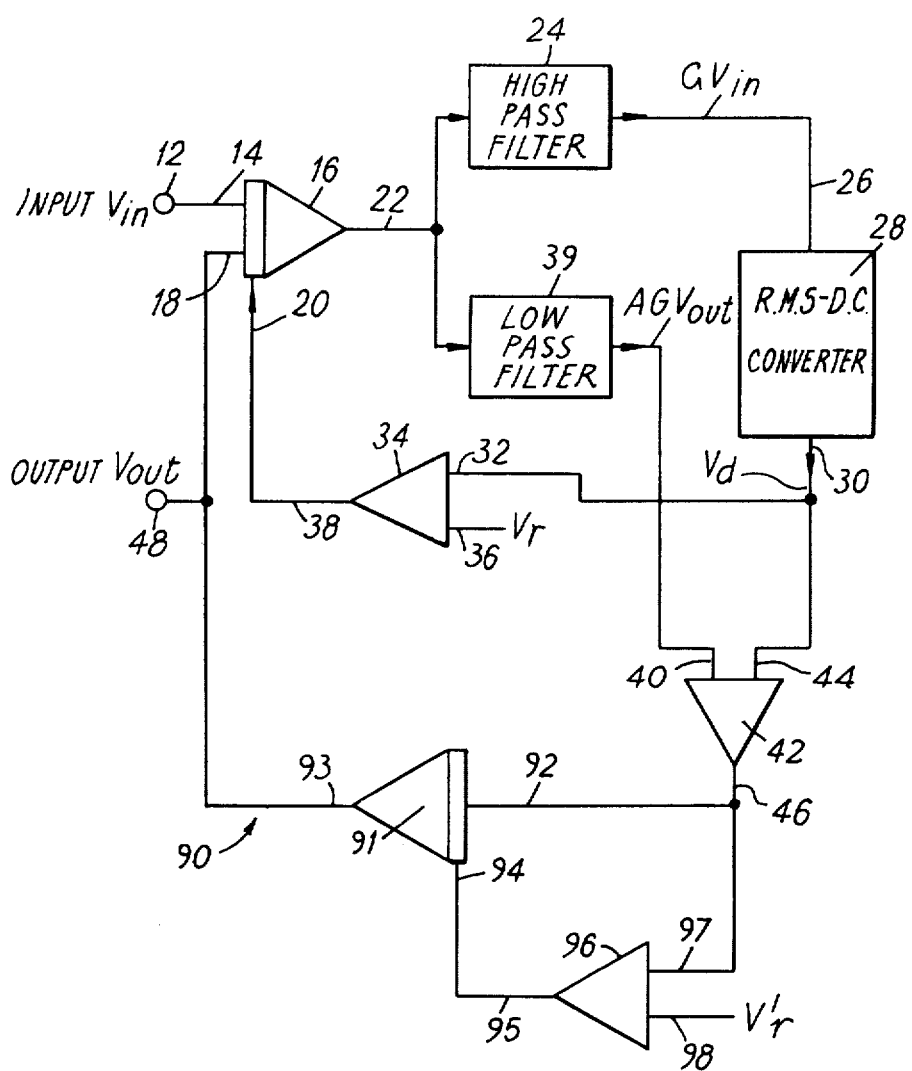

FIG. 5 shows, at 90, a yet further A.C. to D.C. conversion system, which is a modification of, and has many parts in common with, the system 80 of FIG. 4: these common parts are given the same reference numerals as were used in FIG. 4, and only the points of difference will be described. In the system 90 of FIG. 5, the variable gain operational amplifier 82 of FIG. 4 is replaced by a variable gain amplifier 91, having a signal input 92 connected to the output 46 of the voltage comparator 44 and an output 93 connected to the input 18 of the amplifier 16 and to the output terminal 48. The amplifier 91 also has a control input 94, whereby its gain may be varied by means of a variable magnitude D.C. control signal. The control input 94 is connected to receive this D.C. control signal from the output 95 of a voltage comparator 96, which has two inputs 97, 98 connected to receive and compare the voltage at the output 46 of the comparator 42 and a reference voltage $V_r'$ respectively. The reference voltage $V_r'$ may, but need not necessarily, be the same as the reference voltage $V_r$.

The comparator 96 operates to adjust the gain of the amplifier 91 so that the voltage at the output 46 of the comparator 42 remains substantially equal to the reference voltage $V_r'$. It will therefore be appreciated that the gain of the amplifier 91 varies approximately inversely with the gain of the amplifier 16, since the substantially constant voltage at the output 46 of the comparator 42 is amplified by the amplifiers 91 and 16 in cascade to produce a substantially constant voltage at the input 40 of the comparator 42. Thus the operation of the system 90 of FIG. 5 is very similar to the operation of the system 80 of FIG. 4, where the respective gains of the amplifiers 82 and 16 also vary approximately inversely. However, in the system 80 of FIG. 4, the respective gains of the amplifiers 82 and 16 vary over substantially the same dynamic range, since they are both controlled by the output signal produced by the comparator 34, and this dynamic range is determined by the A.C. performance of the amplifier 16. In the system 90 of FIG. 5, on the other hand, the gain of the amplifier 91 is controlled independently of the gain of the amplifier 16: since the amplifier 91 is principally a D.C. amplifier, its gain can be varied over a much wider dynamic range that that of the amplifier 16, thereby further improving accuracy and settling time.

Many modifications can be made to the described embodiments of the invention. For example, any of the amplifiers 16, 16a, 16b, 82 and 91 can employ a voltage-controlled field effect transistor, in place of their respective photosensitive resistors and the light emitting diode associated with these resistors, as the variable resistive element which controls their respective gains. Further, the converter 38 need not be an RMS-sensing converter, but can be a mean-sensing or a peak-sensing converter, in which case the magnitude of the D.C. output signal $V_{out}$ will be linearly related to the mean or peak value respectively of the A.C. input signal $V_{in}$.

What is claimed is:

1. An A.C. to D.C. conversion system comprising:
   variable gain amplifying means for receiving and amplifying an A.C. input signal to be converted;
   an A.C. to D.C. converter connected to receive the amplified A.C. signal from the variable gain amplifying means and arranged to convert the amplified A.C. signal to a first D.C. signal whose magnitude is dependent upon the magnitude of the amplified A.C. signal;
   a first signal comparator arranged to compare the magnitude of the first D.C. signal with a reference magnitude and to produce a control signal dependent on the difference therebetween, the control signal being applied to the variable gain amplifying means to vary the gain thereof, whereby to change the magnitude of the amplified A.C. signal in the sense that tends to reduce the difference between the magnitude of the first D.C. signal and the reference magnitude; and
   a second signal comparator arranged to compare the magnitude of said first D.C. signal with the magnitude of a second D.C. signal and to produce a D.C. output signal dependent upon the difference therebetween, said D.C. output signal being applied to and amplified by the variable gain amplifying means to produce the second D.C. signal and the second signal comparator being operative to maintain the magnitude of the second D.C. signal substantially equal to the magnitude of the first D.C. signal;
   the ratio between the respective gains of the variable gain amplifying means for A.C. and D.C. signals being substantially constant, whereby the magnitude of the D.C. output signal is substantially linearly related to the magnitude of the A.C. input signal.

2. A conversion system as claimed in claim 1, wherein the variable gain amplifying means comprises first and second variable gain amplifiers which are each connected to receive the control signal, and whose respective gains vary in a substantially identical manner in response to the control signal, the first variable gain amplifier having an input for receiving the A.C. input signal and an output at which the amplified A.C. signal appears, and the second variable gain amplifier having an input to which the D.C. output signal is applied and an output at which the second D.C. signal appears.

3. A conversion system as claimed in claim 1, wherein the variable gain amplifying means comprises a single variable gain amplifier, and a high pass filter and a low pass filter both connected to the output of this amplifier, whereby the amplified A.C. signal and the second D.C. signal appear at the respective outputs of the high and low pass filters respectively.

4. A conversion system as claimed in claim 3, wherein the variable gain amplifier includes at least one adjustable light source, the control signal being applied to the light source to vary the amount of light emitted thereby, and at least one circuit element having a parameter which varies in response to the amount of light received by the circuit element and which at least partly defines the gain of the variable gain amplifier, the circuit element being disposed to receive light from the light source.

5. A conversion system as claimed in claim 4, wherein the circuit element comprises a light-responsive resistance element.

6. A conversion system as claimed in claim 5, wherein the variable gain amplifier comprises a high gain amplifier having an input resistance and a negative feedback resistance, at least one of said input and feedback resistances including the light-responsive resistance element.

7. A conversion system as claimed in claim 6, wherein the input resistance is fixed in value and the feedback resistance includes the light-responsive resistance element.

8. A conversion system as claimed in claim 4, wherein the light source comprises a light-emitting diode.

9. A conversion system as claimed in claim 1, wherein the second signal comparator comprises a signal comparison circuit connected to receive the first and second D.C. signals and arranged to produce an intermediate D.C. signal dependent upon the difference in magnitude therebetween, and second variable gain amplifying means connected to receive and amplify the intermediate D.C. signal to produce the D.C. output signal, the gain of the second variable gain amplifying means being arranged to vary approximately inversely with the gain of the firstmentioned variable gain amplifying means, whereby the loop gain of the loop comprising the second signal comparator and the firstmentioned variable gain amplifying means remains approximately constant.

10. A conversion system as claimed in claim 9, wherein the second variable gain amplifying means is connected to receive the control signal, whereby its gain is varied by the control signal.

11. A conversion system as claimed in claim 10, wherein the variable gain amplifier of the firstmentioned variable gain amplifying means comprises an adjustable light source connected to receive the control signal in order to vary the amount of light emitted thereby, and a high gain amplifier having an input resistance and a negative feedback resistance, at least one of said resistances including a light-responsive resistance element disposed to receive light from the light source, and wherein the second variable gain amplifying means also comprises a high gain amplifier having an input resistance and a negative feedback resistance, at least one of said resistances in the second variable gain amplifying means including a further light-responsive resistance element disposed to receive light from the light source.

12. A conversion system as claimed in claim 11, wherein the input resistance of the firstmentioned variable gain amplifying means is fixed in value while the feedback resistance thereof includes the firstmentioned light-responsive resistance element, and wherein the feedback resistance of the second variable gain amplifying means is fixed in value while the input resistance thereof includes the further light-responsive resistance element.

13. A conversion system as claimed in claim 9, wherein the second signal comparator further comprises a second signal comparison circuit arranged to compare the magnitude of the intermediate D.C. signal with a second reference magnitude and to produce a further control signal dependent upon the difference therebetween, the further control signal being applied to the second variable gain amplifier means to vary the gain thereof, whereby to change the magnitude of the intermediate D.C. signal in the sense that tends to reduce the difference between the magnitude of the intermediate D.C. signal and the second reference magnitude.

14. A conversion system as claimed in claim 13, wherein the second reference magnitude is equal to the firstmentioned reference magnitude.

15. A conversion system as claimed in claim 1, wherein the A.C. to D.C. converter comprises an RMS sensing A.C. to D.C. converter.

* * * * *